(12) United States Patent
Buitelaar et al.

(10) Patent No.: US 12,080,488 B2
(45) Date of Patent: Sep. 3, 2024

(54) LOW-TEMPERATURE RADIO-FREQUENCY TUNING CIRCUIT

(71) Applicant: UCL BUSINESS LTD, London (GB)

(72) Inventors: Mark Buitelaar, London (GB); Pavlos Apostolidis, London (GB); Byron Villis, London (GB); Pavlo Zubko, London (GB)

(73) Assignee: UCL BUSINESS LTD, London (GB)

( * ) Notice: Subject to any disclaimer, the term of this patent is extended or adjusted under 35 U.S.C. 154(b) by 73 days.

(21) Appl. No.: 17/597,541

(22) PCT Filed: Jul. 10, 2020

(86) PCT No.: PCT/EP2020/069551
§ 371 (c)(1),
(2) Date: Jan. 11, 2022

(87) PCT Pub. No.: WO2021/005208
PCT Pub. Date: Jan. 14, 2021

(65) Prior Publication Data
US 2022/0351911 A1    Nov. 3, 2022

(30) Foreign Application Priority Data
Jul. 11, 2019  (GB) ..................... 1909976

(51) Int. Cl.
*H01G 7/06*  (2006.01)
*H03F 19/00*  (2006.01)
*H03H 11/28*  (2006.01)

(52) U.S. Cl.
CPC .............. *H01G 7/06* (2013.01); *H03F 19/00* (2013.01); *H03H 11/28* (2013.01); *H03F 2200/451* (2013.01)

(58) Field of Classification Search
CPC ..... H01G 7/06; H03F 19/00; H03F 2200/451; H03H 11/28; H03B 5/12; H03B 2201/0208; H03J 3/185
See application file for complete search history.

(56) References Cited

U.S. PATENT DOCUMENTS

| 3,296,825 A | 1/1967 | Kanzig |
| 2007/0132065 A1 | 6/2007 | Lee et al. |
| 2017/0275178 A1 | 9/2017 | Kim et al. |

FOREIGN PATENT DOCUMENTS

| JP | 2003209266 A | * | 7/2003 | ............. H01L 31/00 |
| JP | 2005508096 A | * | 3/2005 | ............... H01G 7/06 |
| JP | 2012156386 A |   | 8/2012 | |

OTHER PUBLICATIONS

Muller, K.A. and H. Burkard. "SrTio3: An intrinsic quantum paraelectric below 4K." Physical Review B, vol. 19, No. 7, Apr. 1, 1979, pp. 3593 to 3602.

* cited by examiner

*Primary Examiner* — Jung Kim
(74) *Attorney, Agent, or Firm* — William J. Clemens; Shumaker, Loop & Kendrick, LLP

(57) ABSTRACT

A low-temperature radio-frequency tuning circuit has a capacitor and an inductor. The capacitor has a capacitance between two electrodes associated with a dielectric medium, and the capacitance is tunable. The medium is a quantum paraelectric material. The capacitance is tunable by application of a voltage to apply an electric field to the medium. The capacitance is tunable at a temperature of less than 4 K by use of the quantum paraelectric material as the dielectric medium.

15 Claims, 5 Drawing Sheets

LOW-TEMPERATURE RADIO-FREQUENCY TUNING CIRCUIT

FIELD OF THE INVENTION

The present invention relates to an electronic radio-frequency (RF) tuning circuit that is voltage controlled and operable in a low-temperature regime.

BACKGROUND OF THE INVENTION

Tuned electronic circuits consisting of inductive and capacitive elements are electrical resonators that store energy at the circuit's resonant frequency. They are essential components in RF filters and impedance matching networks and have many applications: RF filters are used to suppress unwanted signals in radio-receivers and are building blocks for multiplexers; RF impedance matching networks are used to ensure that power loss between a load and feed line is minimized, improve signal-to-noise ratios in sensitive components such as antennas and low-noise amplifiers, and reduce amplitude and phase errors. The use of voltage-tunable capacitors to the tuned circuits provides further functionalities such as the ability to tune the resonant frequency of the resonators or to optimize impedance matching in circuits for which the load is not a priori known. These circuits also form the basis of voltage-controlled oscillators (VCOs), parametric amplifiers and frequency multipliers.

The voltage-tunable capacitors in the tuning circuit are electronic devices having a capacitance that can be adjusted or 'tuned' by an applied voltage. They are also known by various other names, including voltage-controlled capacitors, varactors, and varicaps. These terms will be considered synonymous, and, for conciseness, the term 'varactor' will generally be used in the following description in place of 'voltage-tunable capacitor'.

Conventional varactors rely on diode operation in semiconductors with p- and n-type regions operated in reverse bias, where the depletion region acts as the dielectric of a capacitor, and the thickness of the depletion region can be voltage controlled. Another conventional type of varactor is the dielectric varactor in which the permittivity changes when a voltage is applied to the varactor due to the saturation of the dielectric polarization. Due to their relatively high permittivity, ferroelectrics such as $Ba_xSr_{1-x}TiO_3$ (BST) are often used for this purpose. Ferroelectric materials are mainly used in their paraelectric state in the temperature region above the Curie temperature.

It can be desirable or necessary to operate radio-frequency tuning circuits at very low temperatures. For example in quantum information processing hardware which is typically operated at temperature below 100 mK (millikelvin) to suppress thermal fluctuations that would otherwise disturb the sensitive quantum states. Quantum hardware often makes use of RF resonators for readout or manipulation of quantum states and the ability to incorporate radio-frequency tuning circuits would, e.g., allow optimizing the readout sensitivity or tune resonant frequencies and multiplex signals to minimize device complexity. Additional applications can be found in electronics for space technology where the ambient temperature is very low.

Integrating voltage-tunable radio-frequency circuits at low temperatures, such as below 1 K (kelvin), however, is problematic. If the tuning element of the circuit consists of a conventional semiconductor diode varactor, the charge carriers freeze out in this temperature regime and the semiconductor varactors stops being tunable. Likewise, if the varactor is a ferroelectric, it loses its tunability at temperatures well below its Curie temperature while unwanted dissipative losses increase.

There is also a large demand for low-temperature (such as mK) and low-noise RF amplifiers in quantum information processing hardware. There are cryogenic RF amplifiers available, but these are based on semiconductor technology and are typically specified for use at 4 K or above as charge carriers freeze out below this temperature. There is only one variety of mK RF amplifier currently available, and that is based on superconducting technologies. These amplifiers are known as Josephson parametric amplifiers (JPAs). However, there are problems with these parametric amplifiers (JPAs) because they are easily saturated (so cannot handle much power), and they cannot be operated in a significant magnetic field because it destroys the superconductivity.

SUMMARY OF THE INVENTION

The present invention has been devised in view of the above problems.

Accordingly, one aspect of the present invention provides a low-temperature radio-frequency tuning circuit comprising:
  at least one capacitor and at least one inductor,
  wherein said at least one capacitor is tunable and comprises:
  a dielectric medium; and
  at least two electrodes associated with the medium,
    wherein the capacitor has a capacitance between two of said electrodes,
  wherein the medium comprises a quantum paraelectric material and the capacitance is tunable by application of a voltage to apply an electric field to the medium, and
  wherein the capacitance is tunable at a temperature of less than 4K.

Another aspect of the present invention provides a use of a tuning circuit as defined in the first aspect of the invention to provide at least one of frequency tuning and/or tunable impedance matching, at a temperature of less than 4K.

Embodiments of the invention can provide a radio-frequency tuning circuit in which a simple and compact varactor is included that is operable at low temperature. A tuning circuit embodying the invention can also be insensitive to magnetic field, so can be employed in a high magnetic field environment.

DESCRIPTION OF THE DRAWINGS

Embodiments of the invention will now be described, by way of example only, with reference to the accompanying drawings, in which.

In the drawings, like parts are given like reference signs, and duplicate description thereof is omitted.

DETAILED DESCRIPTION OF THE INVENTION

Embodiments of the invention comprise a tuning circuit that is a network of inductors and capacitors, connected in parallel and/or in series. The capacitor(s) and inductor(s) can consist of lumped circuit elements (such as discrete components) or distributed elements (such as transmission lines). For brevity, the presence of a capacitance or an inductance in the circuit (whether in lumped or distributed circuit elements) will be referred to using the terms 'capacitor' and 'inductor'. The simplest embodiment comprises a single inductor and a single capacitor connected in series or in parallel (a so-called LC circuit). To be a tuning circuit, at least one of the capacitors or inductors is made to be variable. In embodiments of the present invention, at least one capacitor is a voltage-tunable capacitor, i.e. a varactor, which can operate at low temperature.

Varactor

Firstly, a number of examples of varactors for use in tuning circuits embodying the invention will be described.

Figure 1:
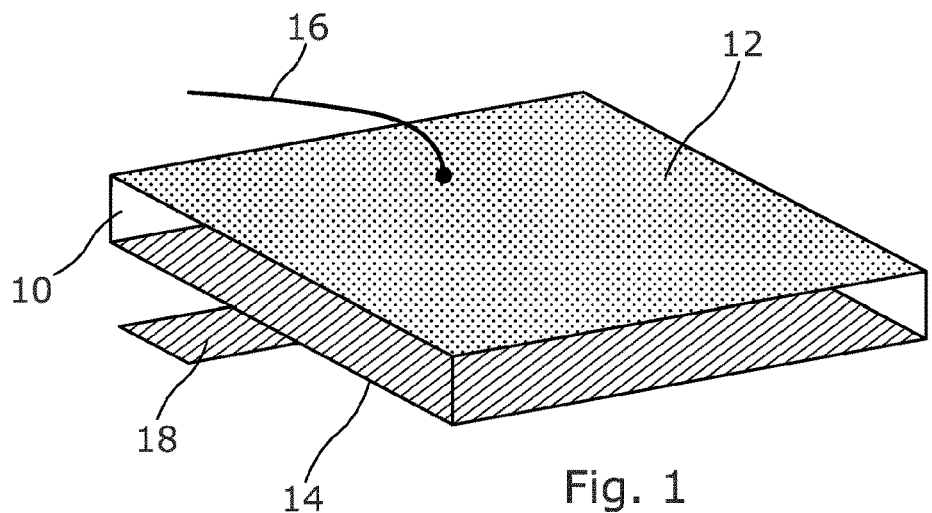
FIG. 1 illustrates schematically the structure of a parallel plate varactor for use in a tuning circuit embodying the invention.

FIG. 1 shows a varactor (voltage-tunable capacitor), for use in an embodiment of the invention, comprising a dielectric medium 10 sandwiched between two opposing electrodes 12, 14. The electrodes 12, 14 are metallic conductors, and this embodiment is in the form of a parallel-plate capacitor. The dimensions of the dielectric medium 10 (hereafter referred to as the 'medium' 10 for conciseness) can be selected based on the desired capacitance of the varactor and the permittivity of the medium 10. The varactor can be a thin-film device, with the medium a few nm thick, such as 100 nm, or the thickness can range up to around 1 mm. The area of each electrode can be in the range from a few 100 square microns to a few square millimeters (the shape of the electrodes and medium is not limited to being square or rectangular).

The medium 10 comprises a so-called 'quantum paraelectric' material (also known as an incipient ferroelectric); this means a material in which ferroelectric order is suppressed by quantum fluctuations down to zero kelvin. In other words, the paraelectric properties remain stable down to extremely low temperatures, such that the permittivity can be tuned using an electric field (to provide a voltage-tunable capacitor) without the onset of ferroelectric order. Examples of suitable materials include strontium titanate (STO), potassium tantalate (KTO), and calcium titanate (CTO). The notional chemical formulae for these examples are $SrTiO_3$, $KTaO_3$, and $CaTiO_3$, respectively, although they may not have exactly these stoichiometric forms, and dopants may also be present as long as they do not induce a transition to a ferroelectric state at low temperatures at which the material is operated. The materials outlined above for the medium 10 can be used in any embodiments of the invention as the dielectric medium.

The use of quantum paraelectric material for the medium enables tunability down to low temperatures, such as below 4K, and at temperatures that may be classed as 'ultra-low', such as below 1 K, below 100 mK, and even below 10 mK.

Electrical connections to the varactor in this embodiment are via a gold wire 16 bonded to the upper electrode 12, and via an electric contact 18 to the lower electrode 14 or directly bonding the lower electrode 14 to a circuit board. However, any suitable connection means known in the art can be used.

Figure 2:
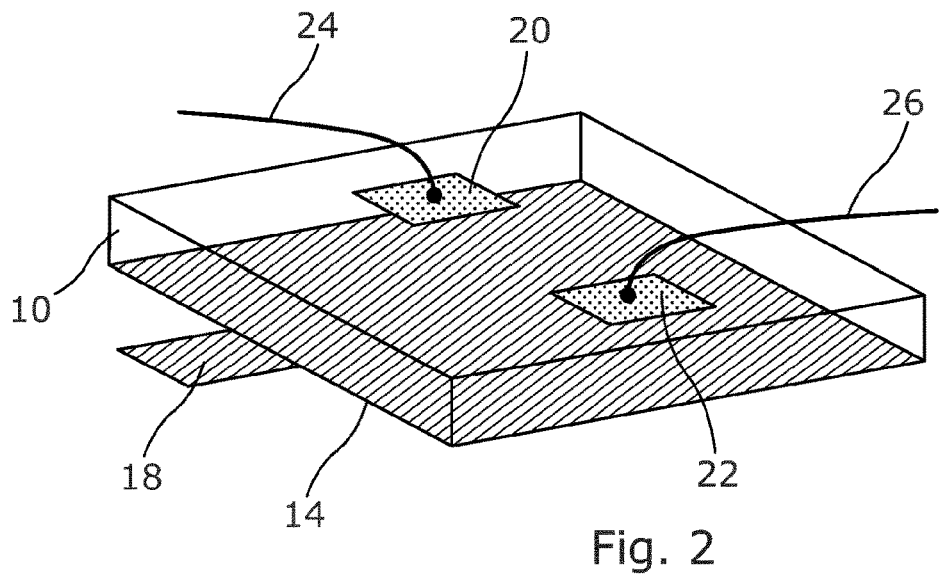
FIG. 2 illustrates schematically a device in which two independently tunable varactors are formed on the same substrate, for use in a tuning circuit embodying the invention.

Another embodiment is illustrated in FIG. 2, in which two independent varactors are formed on a single substrate of dielectric medium 10. The electrode 14 on one surface (the lower surface in FIG. 2) is common to both varactors, but two electrodes 20, 22 are formed on the opposite surface of the medium 10 (the upper surface in the orientation of the device shown in FIG. 2). By separately controlling the bias voltage applied to each (upper) electrode 20, 22, via wires 24, 26, the capacitance between opposed electrodes 20 and 14 (first varactor), and between electrodes 22 and 14 (second varactor), can be separately controlled. If the electrodes 20 and 22 are spaced apart from each other, then the two varactors are tunable independently of each other. Many separate varactors (not just two) can be formed on the same substrate by patterning suitable electrodes using standard microelectronic fabrication techniques.

Figure 3:
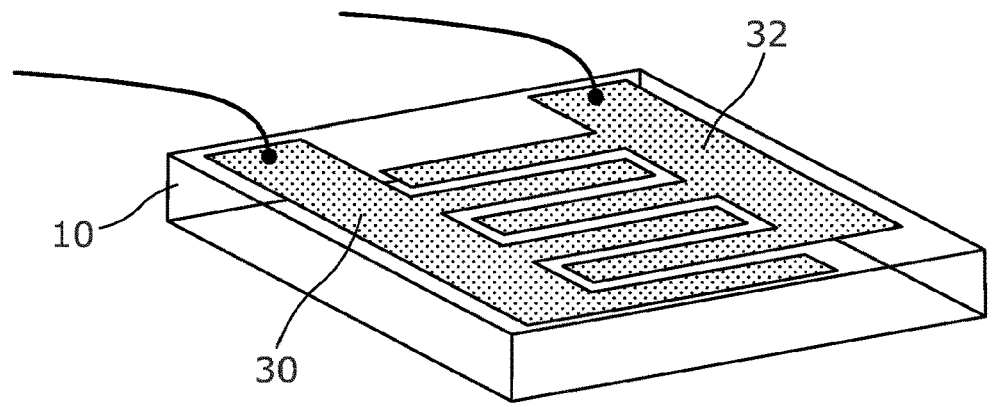
FIG. 3 illustrates schematically a further varactor in which two interdigitated electrodes are formed on the same surface of the dielectric, for use in a tuning circuit embodying the invention.

FIG. 3 illustrates a further embodiment in which the two electrodes 30, 32 of a varactor are coplanar on the same surface of the medium 10, rather than being parallel planes on opposite surfaces of the medium 10. The electrodes 30, 32 are schematically illustrated as being interdigitated, in order to increase the capacitance. In a practical embodiment there can be many more much finer digits forming the interdigitation.

Fabrication of Varactor

The fabrication of an example of a varactor will now be described, in this case the varactor illustrated in FIG. 2. However, these techniques and variants thereof, as well as those generally known from fields such as micro-electronics, are applicable to fabricating other embodiments of the invention.

A STO substrate (single-crystal, (001) oriented, $TiO_2$-terminated, single-side polished) 0.5 mm thick is cut, using a diamond wire saw, into pieces approximately 3 mm×3 mm. For cleaning, the pieces are sonicated for 5 minutes in acetone followed by 5 minutes in IPA (isopropyl alcohol).

One of these substrate pieces (comprising the dielectric medium 10) is loaded in an electron beam evaporator. A thin layer of titanium (approx. 5 nm) is evaporated on the unpolished side, to provide good adhesion, followed by a layer of gold (approx. 60 nm). This is to form the electrode 14, shown in FIG. 2 on the lower surface of the device.

The polished side of the STO substrate piece is coated with a double layer of photoresist. The first layer is Micro-Chem LOR10B photoresist (for successful lift-off after metal evaporation), available from MicroChem Corp. of Newton, MA, spun at 4000 rpm (thickness about 1 micron)

and baked at 190 degrees C. for 10 minutes. The second layer is Microposit S1805 photoresist, available from Rohm and Haas Electronic Materials LLC of Marlborough, MA, spun at 4000 rpm (thickness about 0.5 micron) and baked at 115 degrees C. for 1 minute. A quartz-chrome photomask is used to expose square pads (each 120 microns×120 microns, and separated by about 2 mm from each other) on the photoresist with a photolithography system (exposure time 1.4 s, UV light intensity 15 mW/cm2 at 365 nm wavelength). The substrate piece is then developed in Megaposit MF-26A (Rohm and Haas) for 45 seconds to remove the photoresist from the area of the square pads.

The substrate piece is again loaded in an electron beam evaporator (the opposite way round from the previous time, in order to deposit metal on the photoresist coated side). A thin layer of titanium (approx. 5 nm) is evaporated to provide good adhesion to the substrate, followed by a layer of gold (approx. 60 nm). The substrate piece is sonicated in Microposit Remover 1165 (Rohm and Haas) in a heat bath at 80 degrees C. for photoresist removal (lift off of photoresist and metal from the surface around the exposed square pads). The remaining metal square pads form the electrodes 20 and 22, shown in FIG. 2, providing a pair of capacitors with respect to the electrode 14 on the opposite surface.

In one particular application, the electrode 14 on the lower surface is adhered onto an RF line using silver paste, annealed at 120 degrees C. for 5 minutes for better conductance. The square pads forming the upper electrodes 20, 22 are then bonded to a printed circuit board (PCB) with gold wire 24, 26.

Tuning Circuit

Figure 4:
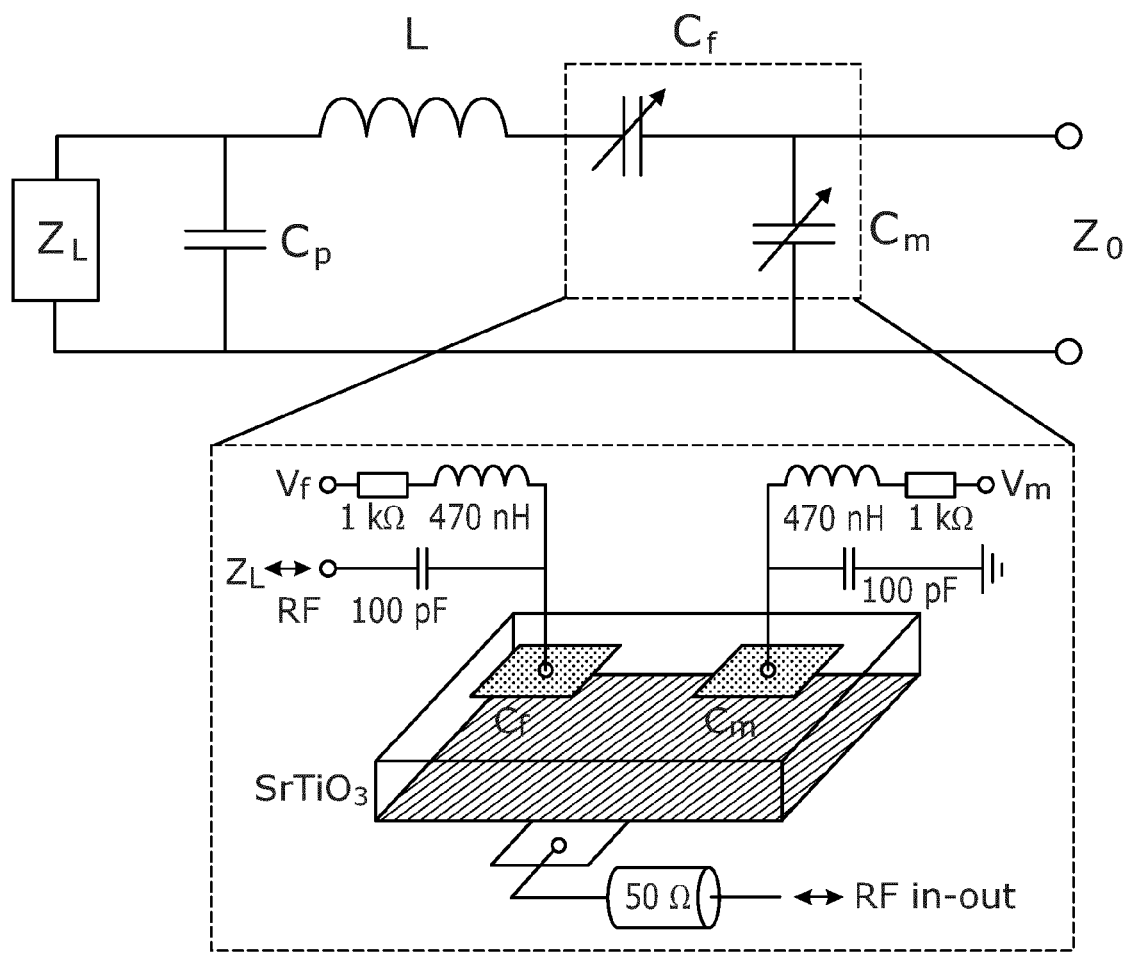
FIG. 4 is a circuit diagram of a tuning circuit according to an embodiment of the invention, and the inset dashed box illustrates schematically further specific details of the circuit.

A tuning circuit according to one embodiment of the invention will now be described with reference to FIG. 4. The tuning circuit is the inductor L, and the two varactors $C_f$ and $C_m$. The inductor L is a Coilcraft 0805CS-331, available from Coilcraft Inc. of Cary, IL, with an inductance of 320 nH. The varactors are a pair using the same medium as a substrate, as described with reference to FIG. 2, fabricated as described above, and as shown in the inset in the dashed box in the lower portion of FIG. 4. Each varactor is tunable from about 15 pF to 40 pF for an applied bias voltage ranging from 20 V to −20 V, and with a maximum capacitance of about 50 pF at −40 V. In FIG. 4, $Z_L$ is the impedance of a load connected to the tuning circuit; $C_p$ represents unavoidable parasitic capacitance (in the experimental set-up used for measurements below, this was about 3.2 pF); and $Z_0$ is the characteristic impedance of the feed lines (typically 50 ohm).

By varying the varactor $C_f$, the resonant frequency of the tuning circuit can be tuned. By varying the varactor $C_m$, the impedance matching of the tuning circuit to the feed lines can be tuned.

The inset of FIG. 4 shows the varactor arrangement in more detail. The PCB (not shown) for the connections in this embodiment is a silver-plated 0.8 mm Rogers 4003C, available from Rogers Corporation of Chandler, AZ The common terminal (lower electrode) is connected to the RF feedline. The upper electrodes of the varactors are each connected using a bias tee with the component values as shown in the inset of FIG. 4. DC bias voltages $V_f$ and $V_m$ are applied to terminals, as illustrated, and from there to the electrodes of the varactors $C_f$ and $C_m$, respectively. The 470 nH inductors (Coilcraft 0805CS-471) pass DC bias voltages but block RF. The upper electrode of the varactor $C_f$ is connected to the inductor L (and ultimately to the load $Z_L$) via a 100 pF capacitor; and the upper electrode of the varactor $C_m$ is connected to ground via a 100 pF capacitor. The 100 pF capacitors pass the RF signal, but block DC.

Performance

The performance of a tuning circuit according to an embodiment of the invention has been investigated. Results will now be presented for the RF tuning circuit of FIG. 4, using the varactor pair of FIG. 2 fabricated with the dimensions and according to the process described above. The measurements were made using a vector network analyzer and with the tuning circuit in a RF-reflectometry circuit operated at a temperature of 6 mK and at RF frequencies in the range of approximately 150 to 200 MHz.

Figure 5A:
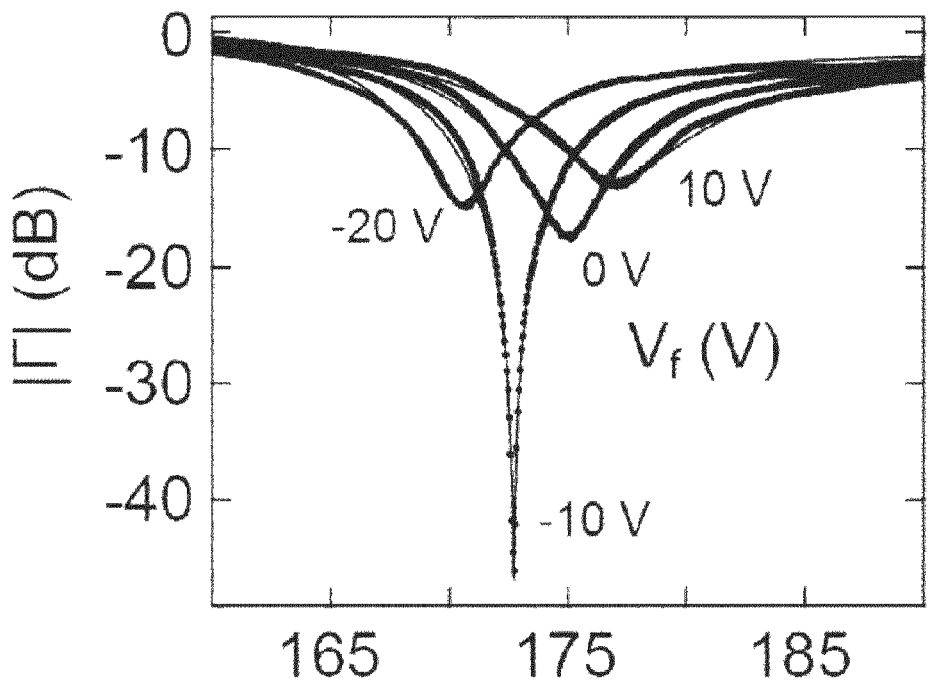
FIG. 5A shows plots of the amplitude response against frequency of a tuning circuit of FIG. 4, according to an embodiment of the invention, as the resonance frequency is tuned.

FIG. 5A shows the amplitude response of the RF circuit incorporating two varactors for a voltage $V_f$ applied to the varactor labelled $C_f$ in FIG. 4. The curves show a shift of the resonance frequency from approximately 170 MHz to 177 MHz for applied voltages ranging from −20 V to 10 V, respectively.

Figure 5B:
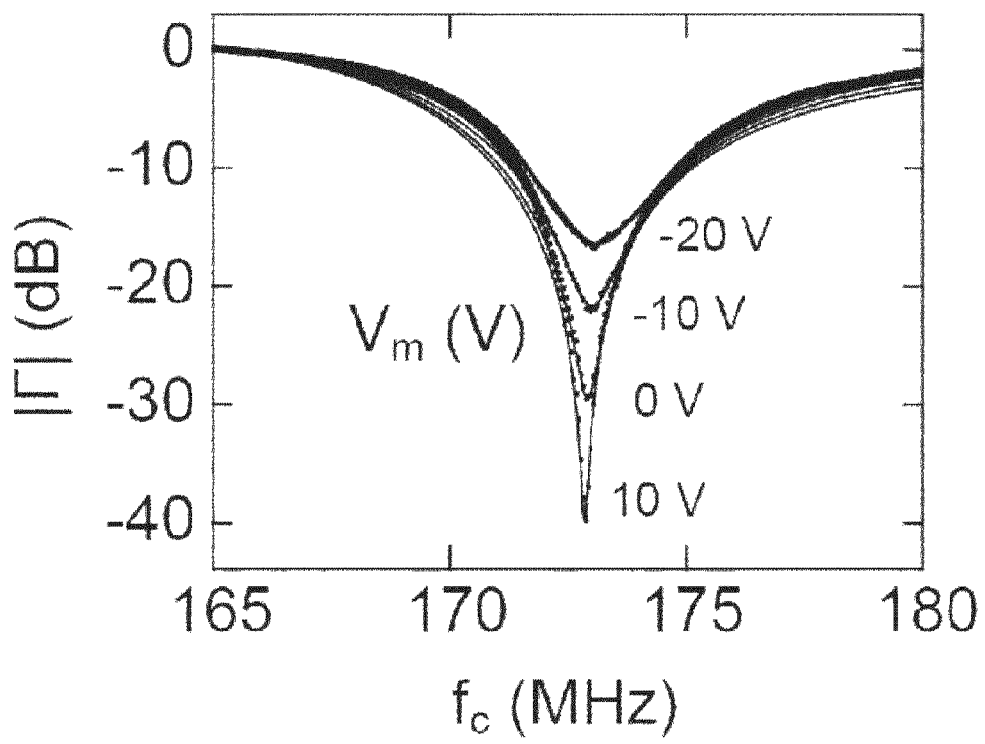
FIG. 5B shows plots of the amplitude response against frequency of a tuning circuit of FIG. 4, according to an embodiment of the invention, as the impedance matching is tuned.

FIG. 5B shows the amplitude response of the RF circuit incorporating two varactors for a voltage $V_m$ applied to the varactor labelled $C_m$ in FIG. 4. The curves show a gradual increase in absorption of the applied RF power (that is, a reduction of the reflected RF power) for applied voltages ranging from −20 V to 10 V.

Figure 6:
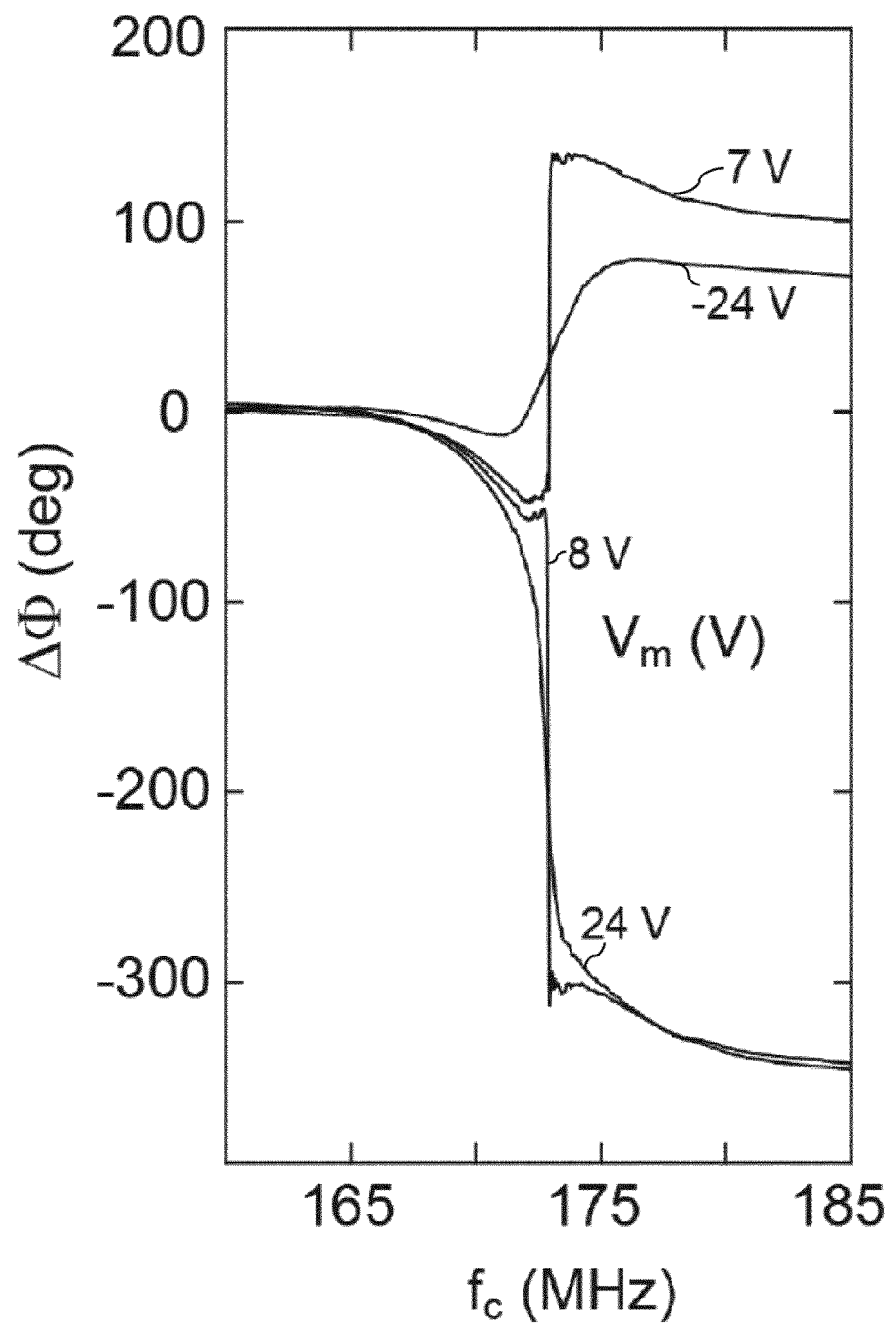
FIG. 6 shows plots of the phase response against frequency of a tuning circuit of FIG. 4, according to an embodiment of the invention, as the impedance matching is tuned.

FIG. 6 shows the phase response of the RF circuit incorporating two varactors for a voltage $V_m$ applied to the varactor labelled $C_m$ in FIG. 4. The curves show a change from under- to over-coupling of the resonator to the feedlines for applied voltages ranging from −24 V to +24 V. For an applied voltage of approximately 7.5 V (between 7 and 8 V), the circuit is perfectly impedance matched to the connecting 50Ω feedlines.

Figure 7:
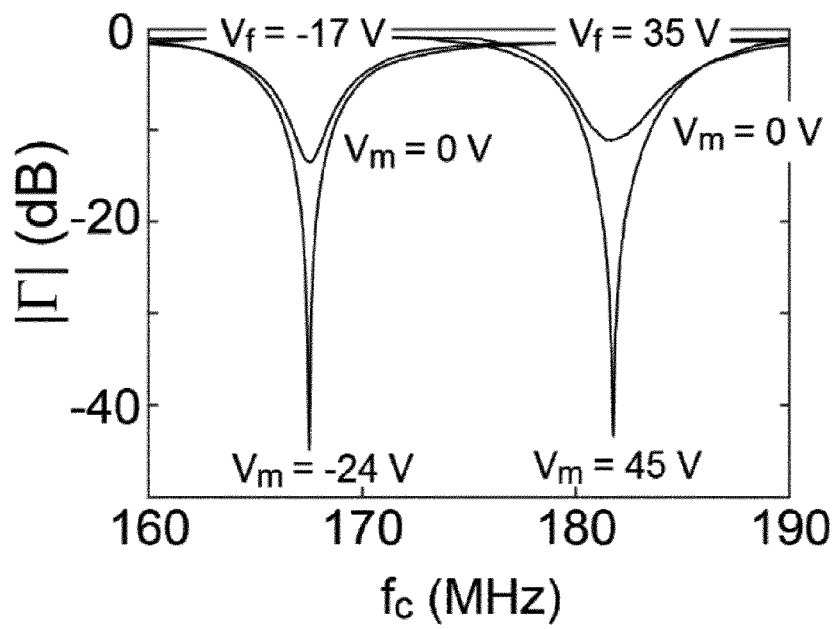
FIG. 7 shows plots of the amplitude response against frequency of a tuning circuit of FIG. 4, according to an embodiment of the invention, as the resonance frequency and the impedance matching are both tuned.

FIG. 7 shows the amplitude response of the RF circuit of FIG. 4, incorporating two varactors, for four different sets of voltages applied to the varactors. These curves show that it is possible to independently set the resonant frequency and obtain impedance matching between the circuit and the connecting 50Ω feedlines in a frequency window between 167 MHz and 182 MHz for control voltages $-50V < V_{f,m} < 50$ V. The obtained frequency shift is larger than the bandwidth of the resonances. More specifically, the left-side of FIG. 7 shows that for a voltage $V_f$ of −17 V applied to the varactor $C_f$ of FIG. 4, the resonant frequency is tuned to approximately 168 MHz, and excellent impedance matching to the feedline is obtained with a voltage $V_m$ of −24 V applied to the varactor $C_m$ of FIG. 4; and the right-side of FIG. 7 shows that for a voltage $V_f$ of 35 V applied to the varactor $C_f$ of FIG. 4, the resonant frequency is tuned to approximately 182 MHz, and excellent impedance matching to the feedline is obtained with a voltage $V_m$ of 45 V applied to the varactor $C_m$ of FIG. 4.

Figure 8:
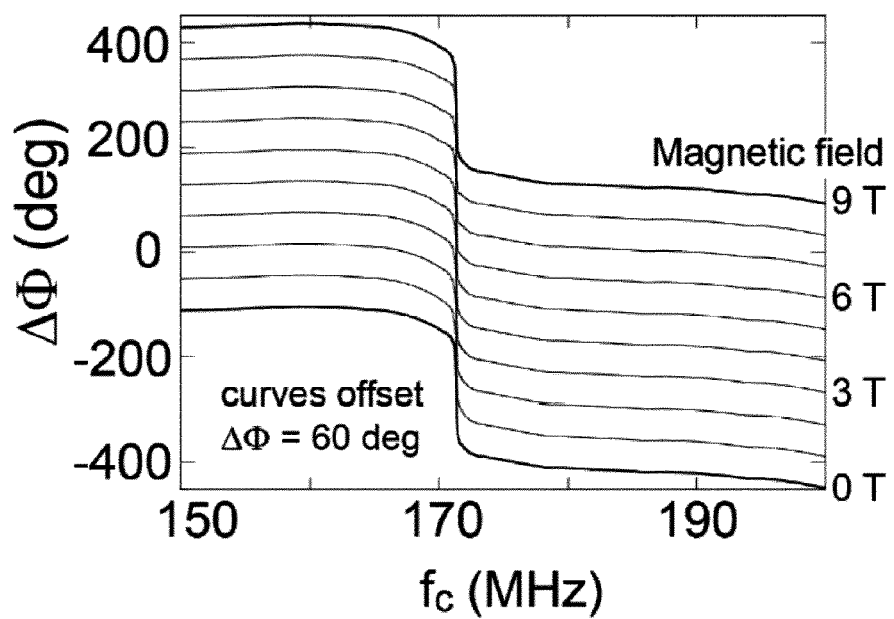
FIG. 8 is graph plotting the phase response against frequency, at a plurality of different magnetic fields, of a tuning circuit embodying the invention, tuned to a resonance frequency of approximately 171 MHz.

FIG. 8 shows the phase response of the RF tuning circuit incorporating the two varactors under the same 6 mK conditions described above, at a specific fixed bias voltage, but under an applied static magnetic field between 0 T (tesla) and 9 T in steps of 1 T. The phase response curves have been successively vertically offset from each other by 60 degrees, for clarity; without this offset in the plots, the curves would be essentially coincident and indistinguishable. The step-change in the phase response indicates the resonance frequency at just over 170 MHz. As can be seen, the resonance frequency does not measurably change with changes in magnetic field. This demonstrates that not only is the circuit operable in a significant magnetic field (up to at least 9 T), but also that the capacitance of the varactor is insensitive to magnetic field over this range (the capacitance changing by a factor of less than 0.5% per 1 T change in magnetic field, and in fact by less than 0.1% per 1 T change in magnetic field).

Applications and Variants

Performance results at 6 mK have shown a tuning circuit according to an embodiment of the invention incorporating at least one varactor being tuned with voltages up to about ±50 V, over a varactor device thickness of 0.5 mm, corresponding to an electric field in the dielectric medium of the order of up to 105 V/m, without loss of the paraelectric property (such as without ferroelectric transition). The actual tuning bias voltages that need to be applied in a particular varactor device to achieve a particular shift in capacitance will depend on the permittivity properties of the medium, and well as on the geometry of the device. For example, tuning voltages required in thin-film varactor devices can be of the order of mV to apply a desired electric field that might require a few volts or tens of volts in thicker devices.

Tuning circuits embodying the invention can operate with signals over a very wide frequency range, such as from 20 kHz to 300 GHz, which is classed as being radiofrequency (RF). Tuning circuits may be fabricated to operate over a specific sub-range within RF. An exemplary RF range within which embodiments of the invention can be used is from 1 MHz to 20 GHz.

Each varactor illustrated in FIGS. 1 to 3 is essentially a two-terminal device in which the DC bias voltage applied across a pair of electrodes is used to tune the capacitance between that same pair of electrodes. To enable both DC and RF signals (or signals at other frequencies) to be applied to the same electrode, bias tees are used as known in the art. However, the present invention is not limited to this arrangement, and devices are envisaged in which one or more of the electrodes for applying an electric field to the medium are distinct from the signal electrodes that exhibit the tunable capacitance.

The choice of material for the quantum paraelectric medium can be based on desired properties of the varactor. For example, at temperatures below approximately 1 K, KTO benefits from a loss factor up to two orders of magnitude smaller for a given capacitance as compared to STO, as used in the varactors of which the performance results are shown in FIGS. 4 to 8. This comes at the expense, however, of a lower electric-field tunability of its relative permittivity.

A tuning circuit embodying the invention, which is tunable at low temperatures, can be useful in a variety of applications, for example in circuits for readout of charge detectors such as single-electron transistors and quantum point contacts, as well as for quantum dot devices that host charge or spin qubits. Many of these systems require mK temperatures and circuits operating at frequencies classed as RF. By employing a circuit of the invention, and tuning the capacitance of the varactor, it is possible to substantially perfectly impedance match the quantum device to the RF feedline that connects to the device. This ensures optimum power transfer to the quantum device and the best readout sensitivity. In addition, to achieve optimal performance when using RF components in the detection circuit, such as low-noise amplifiers which have a narrow operation bandwidth or for multiplexing signals of several readout channels, it is necessary to tune the resonant frequency of the circuit. Again, a tuning circuit embodying the invention can be used at mK temperatures to tune the resonant frequency.

The circuit shown in FIG. 4, comprising a pair of varactors, independently tunable, is particularly advantageous because one of the varactors can be used for impedance matching and the other can be used for resonant frequency tuning.

Tuning circuits of the invention can be used in other quantum information processing hardware (not just quantum dot qubits), for example, superconducting qubits, molecular qubits, and ion traps. The tuning circuits can also be used in low-noise, low-temperature parametric RF amplifiers. Parametric amplifiers are particularly suitable for low-temperature applications (for example for operation at mK temperatures) because of their relatively low power consumption. The insensitivity to magnetic field of the embodiments of the invention is particularly advantageous for applications in which a magnetic field is used to tune device characteristics, such as spin-based quantum information processing.

Tuning circuits according to the invention can also be used in space applications, such as in satellites or space probes, where the lowest temperature is around 3 K, because the circuits retain their tunability in this low temperature environment.

In accordance with the provisions of the patent statutes, the present invention has been described in what is considered to represent its preferred embodiment. However, it should be noted that the invention can be practiced otherwise than as specifically illustrated and described without departing from its spirit or scope.

The invention claimed is:

1. A low-temperature radio-frequency tuning circuit comprising:
   a voltage-tunable capacitor and an inductor,
   wherein the capacitor is tunable and comprises:
      a dielectric medium; and
      two electrodes associated with the medium, wherein the capacitor has a capacitance between the electrodes,
   wherein the medium comprises a quantum paraelectric material and the capacitance is tunable by application of a voltage to apply an electric field to the medium, and
   wherein the capacitance is tunable at a temperature of less than 4 kelvin.

2. The tuning circuit according to claim 1 wherein the medium comprises at least one of strontium titanate, potassium tantalate, and calcium titanate.

3. The tuning circuit according to claim 1 wherein the capacitance is tunable at a temperature of less than 1 kelvin.

4. The tuning circuit according to claim 1 wherein the capacitance is tunable at a temperature of less than 100 millikelvin.

5. The tuning circuit according to claim 1 wherein the capacitance is tunable at a temperature of less than 10 millikelvin.

6. The tuning circuit according to claim 1 wherein application of a bias voltage between the electrodes tunes the capacitance.

7. The tuning circuit according to claim 1 wherein the electrodes are on a same side or on opposite sides of the dielectric medium.

8. The tuning circuit according to claim 1 including at least two of the tunable capacitors formed on a common substrate that is the medium.

9. The tuning circuit according to claim 1 operable in a magnetic field of at least 1 tesla.

10. The tuning circuit according to claim 1 wherein the capacitance is altered by less than 0.5% per 1 tesla change of an applied magnetic field.

11. A low-temperature radio-frequency parametric amplifier comprising at least one of the tuning circuit according to claim 1.

12. A method of using the tuning circuit according to claim 1 to provide at least one of frequency tuning and tunable impedance matching at a temperature of less than 4 kelvin.

13. The method according to claim 12 wherein the temperature is less than one of 1 kelvin, 100 millikelvin and 10 millikelvin.

14. The method according to claim 12 including applying a bias voltage to apply an electric field to the medium to tune the capacitance of the capacitor.

15. The method according to claim 12 including operating the tuning circuit in a magnetic field of at least 1 tesla.

* * * * *